United States Patent [19]

Hatfield

[11] Patent Number: 4,683,652

[45] Date of Patent: Aug. 4, 1987

[54] PRINTED CIRCUIT REPAIR PROCESS

[76] Inventor: Jerry L. Hatfield, P.O. Box 6041, Lakeland, Fla. 33803

[21] Appl. No.: 899,091

[22] Filed: Aug. 22, 1986

[51] Int. Cl.$^4$ .............................................. H05K 3/00
[52] U.S. Cl. .................................. 29/829; 29/402.01; 29/846; 174/68.5; 427/140
[58] Field of Search ............ 29/846, 829, 852, 402.01; 427/140, 96; 174/68.5

[56] References Cited

U.S. PATENT DOCUMENTS

| | | | |
|---|---|---|---|
| 3,228,093 | 1/1966 | Bratton | 29/846 |
| 3,528,048 | 9/1970 | Kirk | 174/68.5 X |
| 3,705,047 | 12/1972 | Marriott | 427/140 X |
| 3,775,579 | 11/1973 | Burghart et al. | 29/402.01 X |
| 4,200,668 | 4/1980 | Segal et al. | 427/140 X |
| 4,259,367 | 3/1981 | Dougherty, Jr. | 427/96 |
| 4,438,561 | 3/1984 | Mueller | 29/846 X |

FOREIGN PATENT DOCUMENTS 1440152  10/1968  Fed. Rep. of Germany ........ 427/96

Primary Examiner—Howard N. Goldberg
Assistant Examiner—Carl J. Arbes
Attorney, Agent, or Firm—Frijouf, Rust & Pyle

[57] ABSTRACT

A method of repairing an electrical conductor path interruption on a printed circuit board in the presence of heat sensitive electrical components is disclosed. The area proximate the electrical conductor path interruption is cleaned to electrically expose the conductor and area proximate the electrical interruption and to remove any dielectric material thereat which would interfere with electrical conductivity. A mask is applied to the surface of the printed circuit board parallel to the electrical conductor path and on each side of the electrical interruption adjacent the cleaned area to provide a channel which includes the electrical interruption along a portion of the electrical conductor path. At least one coat of an electrically conductive paint is applied within and along the channel to conductively connect the electrical conductor path interruption. The applied electrically conductive paint is allowed to harden. The conductive paint connection is then tested to insure electrical continuity along the involved paths. The mask is removed from the surface of the printed circuit board and at least one sealer coat is applied to the area proximate the applied electrically conductive paint to seal and protect the electrically conductive paint and the area proximate the conductive paint, thereby reestablishing the electrical conductor path.

8 Claims, 1 Drawing Figure

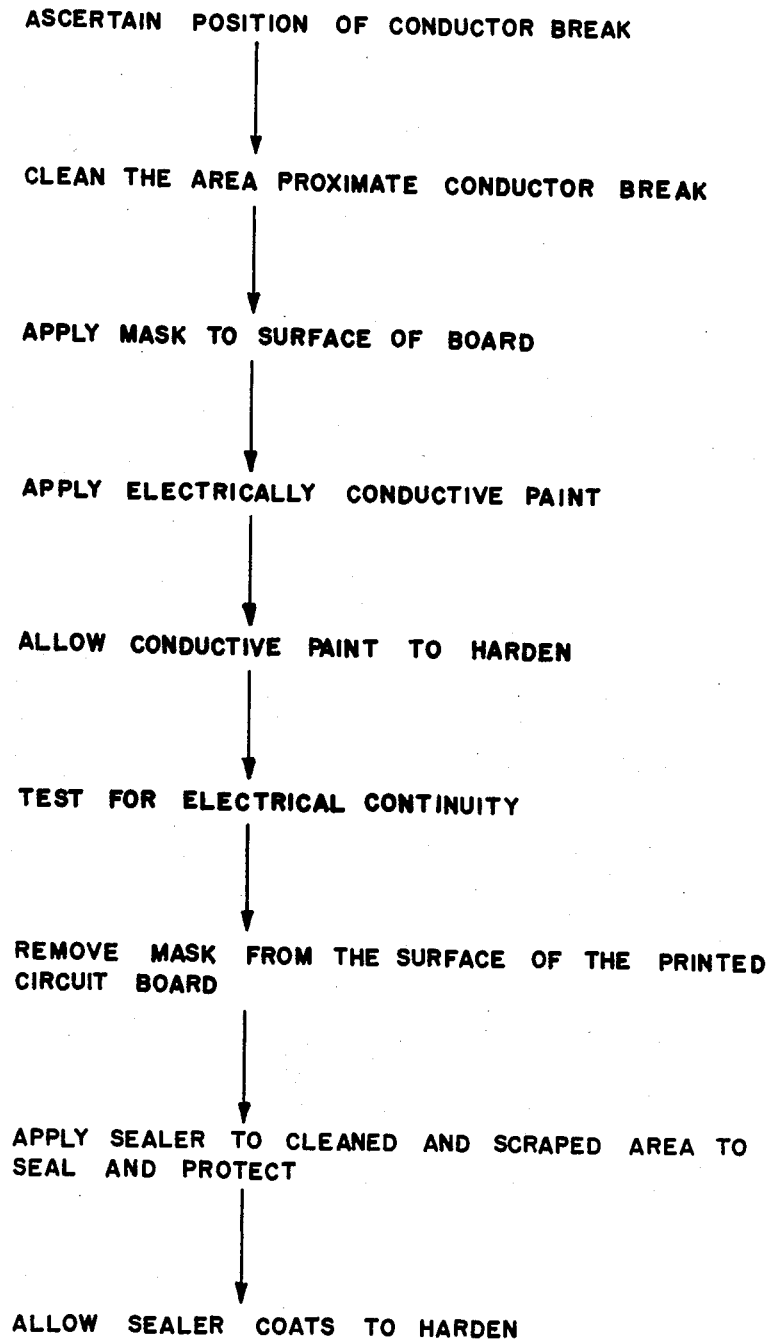

PRINTED CIRCUIT REPAIR PROCESS

BACKGROUND OF THE INVENTION

1. Field of the Invention

This invention relates to a process for repairing an electrical printed circuit and more particularly to repairing an electrical interruption in the circuit path.

2. Information Disclosure Statement

Conductor path interruptions occur during manufacturing, repairing or as a result of physical shock or vibration. An interruption in one circuit connector will in many cases cause the total failure of the printed circuit board. Accordingly, a small defect in the printed circuit may necessitate the replacement of the entire printed circuit board and the associated components.

One process utilizes a device which holds a specifically shaped metallic part above the conductor path interruption. The device lowers the metallic part onto the conductor path and micro-resistance welds the shaped metallic part to the circuit so as to electrically reestablish the conductor path interruption.

Another prior art method seems to suggest the use of an insulated wire extending or bridging the electrical gap in the printed circuit.

In another process for manufacturing printed circuits, a resinous conductive ink circuit is printed on an electric board. While the ink is wet, the inked circuit is covered with a conductive metal powder. The powder is pressed into the ink and is allowed to cure. A solder paste is printed over the circuit and the board heated to cause the solder to alloy with the ink and powder to complete the method. A particular apparatus is employed to carry out the process.

Another process discloses an electrically conductive adhesive for bonding small semi-conductor components to a substrate. This patent fails to teach or suggest any tendency for a substance to bridge any gap. The disclosure of this patent is limited to the adhering of one small object to another through an electrically conductive bond.

Another method is drawn to an improved composition for a metallic ink as well as an improved method of use involving a low melting point metal first used in conjunction with a conductive ink. The combination is fired after the ink is screened in place in order to produce a relatively thick film on a substrate or semi-conductor device for making subsequent electrical contact by any one of various methods including clamping and soldering.

Another method utilizes a rather complex system to find a conductor path break and suggests the the gap may be bridged by the use of an insulated wire extending point to point across the gap.

Another method involves making contact between two conductors of printed circuits on opposite sides of a non-conducting substrate used as a circuit board. Holes are drilled through the board at the appropriate points. In the preferred embodiment, the sides of the holes are electroplated with a conductive material to permit electrical communication from circuits on one side of the board to the other.

The aforementioned methods utilize rather complex devices or insulated wire to effect the repair of a conductor break.

Accordingly, it is an object of this invention to provide a method of repairing an electrical conductor path interruption on a printed circuit board which is economical and simple to perform.

It is a further object of this invention to provide a method of repairing an electrical conductor path interruption on a printed circuit board in the presence of heat sensitive electrical components.

It is a further object of this invention to provide a method of repairing an electrical conductor path interruption on a printed circuit board without the need for welding a metallic conductor at the site of the interruption.

It is a further object of this invention to provide a method of repairing an electrical conductor path interruption on a printed circuit board without the need for metallic strips to bridge the interruption.

It is a further object of this invention to provide a process which allows for a simple and complete repair of conductor path breaks without the use of a complex device.

It is a further object of this invention to provide a method of repairing an electrical conductor path interruption on a heat sensitive dielectric printed circuit board such as impregnated paperboard.

The foregoing has outlined some of the more pertinent objects of the present invention. These objects should be construed to be merely illustrative of some of the more pertinent features and applications of the invention. Many other beneficial results can be obtained by applying the disclosed invention is a different manner or modifying the invention within the scope of the disclosure. Accordingly, other objects and a fuller understanding of the invention may be had by referring to the summary of the invention and the detailed description describing the preferred embodiment in addition to the scope of the invention defined by the claims taken in conjunction with the accompanying drawings.

SUMMARY OF THE INVENTION

This invention is defined by the appended claims with a specific embodiment shown in the attached drawings. For purposes of summarizing the invention, the invention may be incorporated into a method of repairing an electrical conductor path interruption on a printed circuit board in the presence of heat sensitive electrical components comprising the steps of ascertaining the position of the electrical conductor path interruption or break along the electrical conductor path. The area proximate the electrical conductor path interruption is then cleaned to conductively expose the electrical conductor strip and to remove any dielectric material thereat which could interfere with electrical conductivity. A mask is then applied to the surface of the printed circuit board on each side of the electrical interruption in a spaced apart and parallel manner relative the involved conductor path and cleaned electrical conductor path. The mask segments, such as two tape segments, on each side of the electrical interruption, provide a channel which includes the electrical interruption along the electrical conductor path, and an area extending above and below the interruption. At least one coat of an electrically conductive paint is applied within and along the channel to conductively bridge the electrical conductor path interruption thereby reestablishing the electrical conductor path. The applied electrically conductive paint is permitted to harden by curing or drying. The circuit is then tested for electrical continuity to insure that electrical continuity along the involved path has been reestablished. The mask is then removed from the surface of the printed circuit board leaving the applied conductive channel extending along the conductor path and bridging the conductor break. Preferably, at least one sealer coat is applied to the area proximate the applied electrically conductive paint to seal and protect the electrically conductive paint and the cleaned are proximate the conductive paint. The sealer coats are permitted to harden by curing or drying to enhance the protection of the board and electrical conductor strip.

In an alternative embodiment, a mask is first applied to the surface of the printed circuit board parallel to the electrical conductor path and on each side of the electrical interruption prior to cleaning. Taping prior to the cleaning and scraping process insures that the conductor paths adjacent the conductor path with the break will be protected from inadvertent scraps which may occur during the cleaning-scraping process especially where the break is in an area where there is a high concentration of individual conductor paths.

The area covered by the mask includes a portion proximate and running parallel to the electrical conductor and on each side of the conductor. The mask includes two taped segments, one positioned on either side of the conductor path, to provide a channel which includes the electrical interruption of the electrical conductor path and an area extending slightly above and slightly below the break. The taped area extends about one-half to three-fourths of an inch in each direction from the break in a parallel and spaced apart manner relative the involved path.

Preferably, the area proximate the electrical conductor path interruption is cleaned by scraping with a mildly abrasive instrument or tool. Scraping insures that any sealer coatings and/or oxides present on the electrical conductor are removed since both sealer coats and oxides inhibit electrical conductivity. A chemical cleaner may be used to clean the sealer coat from the surface of the printed circuit. However, the area so cleaned should also be scraped in order to remove any oxides which may not be removed by the chemical cleaner.

In one embodiment, the electrically conductive paint is a metallic conductive paint, such as LOCTITE. Another electrically conductive paint is copper acrylic conductive paint. Preferably, the electrically conductive paint is applied to the conductor break within the channel defined by the mask by brushing. However, any method of applying the liquid conductive paint to the area of the electrical conductor path interruption is within the scope of the invention. For example, the conductive paint may be rolled on by the use of a small and narrow roller or the like.

The preferred method of ascertaining the position of the electrical conductor path interruption along the electrical conductor path is accomplished by testing for continuity from one point in the printed circuit to another point in the printed circuit by means of an ohm meter. However, visual observation may suffice. On some occasions, it has been necessary to slightly flex the board during the continuity test in order to find the break in the electrical conductor path.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should be realized by those skilled in the art that such equivalent constructions do not depart from the spirit and scope of the invention as set forth in the appended claims.

BRIEF DESCRIPTION OF THE DRAWING

For a fuller understanding of the nature and objects of the invention, reference should be had to the following detailed description taken in connection with the accompanying drawing in which:

The FIGURE is a flow diagram illustrating the steps used to repair a break in an electrical conductor path printed on a printed circuit board according to the invention.

DETAILED DESCRIPTION

In accordance with the present invention the position of conductor break along the conductor paths of the printed circuit is first ascertained. This is usually accomplished by testing for electrical continuity from one point along a conductor path to another point in the same conductor path in the printed circuit by the use of an ohm meter or the like, in a manner well known in the art. Visual observation of the conductor path break may be possible, especially where there is an apparent injury to the conductor path on board such as where the board has been bent or cracked.

The area proximate conductor break must be cleaned in order to remove any dielectrica material prximate the break. This insures that a good electrical contact will be obtained when the conductive paint is applied. The preferred method of cleaning is the use of a scraping tool which not only removes any dielectric material such as insulation or sealer coats applied to the surface of the board, but also removes any metal oxides which may have formed on the electrical conductor after the break. This is especially important where the sealer coats have been visably damaged or broken. Under these conditions, oxides of the metallic conductor usually form which inhibit electrical conductivity. Accordingly, it is preferred that the conductive paint be applied to the conductor break soon after scraping in order to reduce the formation of oxides on the scraped conductor.

In order to obtain a good electrical connection across the break, it is necessary to clean back into and along the conductor on each side of the break. The circuit layout on most boards presents conductor paths which are closely spaced relative to each other. Accordingly, both the scraping and painting portions of the inventive method must be accomplished with the utmost care. Excess scraping or scraping over electrically conductive areas may further damage an already inoperative circuit board. Misapplication of the conductor paint may inadvertently connect conductor paths which may result in further damage to, at least, the circuit components and board. Accordingly, it is most preferred to apply mask, such as an adhesive backed tape, to the surface of the board in an area proximate the undamaged conductor break prior to scraping to protect the conductive paths from inadvertent scraping and from misapplied conductive paint. Tapes which perform this function are known and include plastic electrician's tape and the like. The adhesive used on most elecrician's tape allows the tape to be removably attached to the circuit board without damage to the board or the conductor paths and the components thereon. Also, electrician's tape does not adhere to the conductive paint thereby permitting easy removable of the tape after the conductive paint has hardened.

The mask is applied to the surface of the printed circuit board parallel to and along the electrical conductor path and on each side of the electrical interruption adjacent the scraped area to provide a channel which includes the electrical interruption along the electrical conductor path.

The electrically conductive paint is applied to the area within channel, which is the width between the two substantially parallel segments of the mask containing the conductor path break therebetween. In general, conductor paths produced by etching have a thickness or height of about 30 $\mu$m and a width of about 120 to 150 $\mu$m. While the number of coats of conductive paint establish the height or thickness of the paint within the channel, the thickness of the mask aids in the height of the conductive paint within the channel. Furthermore, the spacing between the two segments of mask substantially establishes the width of the conductive paint applied to the board. Generally, two coats of conductive paint are sufficient with about 1-2 minutes drying time between the coats. Electrically conductive paints are known in the art as disclosed in U.S. Pat. No. 4,387,115 which is incorporated herein by reference.

The conductive paint is allowed to completely harden by curing or drying to insure a hard and durable coat. Usually the paint dries in about 1 or 2 minutes. The circuit is then tested for electrical continuity, usually by a meter similar to that used to ascertain the break position or by powering the circuit and ascertaining its operability. If the circuit is operable or the meter indicates an electrical continuity, the mask is carefully removed from the surface of the printed circuit board. A dielectric sealer, such as a silicone based product, is applied to the scraped area and to the applied conductive paint to seal and protect the electrically conductive paint and the area proximate the conductive paint from oxidation and other damaging effects due to heat, humidity and the like. The sealer coats are allowed to harden in order to insure their hardness which will protect the repaired portion from minor physical abuse. Usually this occurs in about 5-10 minutes.

The present disclosure includes that contained in the appended claims as well a that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

What is claimed is:

1. A method of repairing an electrical conductor path interruption on a thin printed circuit board in the presence of heat sensitive electrical components comprising the steps of:

ascertaining the position of the electrical conductor path interruption along the electrical conductor path;

cleaning the area proximate the electrical conductor path interruption to expose the electrical conductor strip and to remove any dielectric material thereat which would interfere in electrical conductivity;

applying a mask to the surface of the printed circuit board in a manner substantially parallel to the electrical conductor path and on each side of the electrical interruption adjacent the cleaned area for providing a channel which includes the electrical interruption along the electrical conductor path;

applying at least one coat of an electrically conductive paint within and along the channel to bridge the electrical conductor path interruption thereby reestablishing the electrical conductor path;

allowing the applied electrically conductive paint to harden;

testing for electrical continuity;

removing the mask from the surface of the printed circuit board;

applying at least one sealer coat to the area proximate the applied electrically conductive paint to seal and protect the electrically conductive paint and the area proximate the conductive paint; and allowing the sealer coats to harden thereby repairing the electrical conductor path interruption.

2. The method of claim 1 wherein the electrically conductive paint is applied by brushing.

3. The method of claim 1 wherein the area proximate the electrical conductor path interruption is cleaned by scaping.

4. The method of claim 1 wherein the position of the electrical conductor path interruption along the electrical conductor path is ascertained by testing for continuity from one point in the printed circuit to another point in the printed circuit by means of a volt-ohm meter.

5. The method of claim 1 wherein the mask is applied to the surface of the printed circuit board prior to cleaning the area proximate the conductor break in order to protect undamaged conductor paths proximate the electrical conductor path interruption and to define the area to be cleaned.

6. A method of repairing an electrical conductor path interruption on a printed circuit board comprising the steps of:

providing a printed circuit board having heat sensitive electrical components positioned thereon;

ascertaining the position of the electrical conductor path interruption along the electrical conductor path;

cleaning the area proximate the electrical conductor path interruption to expose the electrical conductor strip and to remove any dielectric material thereat which would interfere in electrical conductivity;

applying a mask to the surface of the printed circuit board parallel to the electrical conductor path and on each side of the electrical interruption adjacent the cleaned area to provide a channel which includes the electrical interruption along the electrical conductor path;

applying at least one coat of an electrically conductive paint within and along the channel to bridge the electrical conductor path interruption thereby reestablishing the electrical conductor path;

allowing the applied electrically conductive paint to harden;

testing for electrical continuity;

removing the mask from the surface of the printed circuit board;

applying a plurality of sealer coats to the area proximate the applied electrically conductive paint to seal and protect the electrically conductive paint and the area proximate the conductive paint; and allowing the sealer coats to harden thereby repairing the electrical conductor path interruption.

7. The method of claim 6 wherein the printed circuit board is formed of heat sensitive material.

8. The method of claim 6 wherein the mask is applied to the surface of the printed circuit board prior to cleaning the area proximate the conductor break in order to protect undamaged conductor paths proximate the electrical conductor path interruption and to define the area to be cleaned.

* * * * *